United States Patent [19]

Kasano

[11] 3,836,408

[45] Sept. 17, 1974

[54] PRODUCTION OF EPITAXIAL FILMS OF SEMICONDUCTOR COMPOUND MATERIAL

[75] Inventor: Hiroyuki Kasano, Akishima, Japan

[73] Assignee: Hitachi, Ltd., Tokyo, Japan

[22] Filed: Dec. 21, 1971

[21] Appl. No.: 210,418

[30] Foreign Application Priority Data

Dec. 21, 1970 Japan .............................. 45-114171
July 19, 1971 Japan .............................. 46-53077

[52] U.S. Cl. ............ 148/175, 117/106 A, 148/174, 252/62.3 GA

[51] Int. Cl. ........ H01l 7/36, C23c 11/00, H01l 3/00

[58] Field of Search .................... 148/1.5, 174, 175; 117/106 A; 252/62.3; 23/204

[56] References Cited

UNITED STATES PATENTS

| | | | |
|---|---|---|---|
| 3,047,438 | 7/1962 | Marinace | 148/175 |
| 3,065,116 | 11/1962 | Marinace | 148/175 X |
| 3,224,913 | 12/1965 | Ruehrwein | 148/175 |
| 3,310,425 | 3/1967 | Goldsmith | 117/106 |
| 3,421,952 | 1/1969 | Conrad et al. | 148/175 |
| 3,462,323 | 8/1969 | Groves | 148/175 |
| 3,635,771 | 1/1972 | Shaw | 148/175 |

OTHER PUBLICATIONS

Goldsmith et al., "Vapor-Phase Synthesis and Epitaxial Growth of GaAs" R.C.A. Review, V. 24, 1963 (December), pp. 546–554.

Taylor, R. C., "Epitaxial Deposition of GaAs in an Argon Atmosphere" J. Electrochem. Soc., V. 114, No. 4, April, 1967, pp. 410–412.

Lawley, K. L., "Vapor Growth Parameters–Hydrogen-Water Vapor Process" IBID., V. 113, No. 3, March 1966, pp. 240–245.

Effer, D., "Epitaxial Growth of Doped–Open Flow System" IBID., V. 112, No. 10, October 1965, pp. 1020–1025.

*Primary Examiner*—L. Dewayne Rutledge
*Assistant Examiner*—W. G. Saba
*Attorney, Agent, or Firm*—Craig & Antonelli

[57] ABSTRACT

A method of epitaxially growing, preferably, a III – V compound semiconductor onto a substrate by forming a gaseous stream of (1) a gaseous mixture formed by a reaction of hydrogen halide (or water vapor) and a group III element and (2) at least one group V element; disposing a III – V compound semiconductor or a constituting element of a III – V compound semiconductor in a region held at a high temperature upstream of the substrate; reacting the gaseous stream, particularly unreacted hydrogen halide (or unreacted water vapor) with the disposed material and passing the thus reacted gaseous stream into contact with the substrate to deposite the III – V compound semiconductor on its surface. The substrate is maintained at a lower temperature than the disposed material. This process is similarly applied to mixed crystals as well as compound semiconductor layers of other groups.

6 Claims, 4 Drawing Figures

INVENTOR

HIROYUKI KASANO

BY Craig, Antonelli & Hill
ATTORNEYS

PRODUCTION OF EPITAXIAL FILMS OF SEMICONDUCTOR COMPOUND MATERIAL

BACKGROUND OF THE INVENTION

The present invention relates to a method of the vapor epitaxial growth of III – V compound semiconductor crystals.

Semiconductor devices employing III – V compound semiconductors, have recently been put into practice mainly in Gunn diodes, varactor diodes, light-emitting diodes, etc. As a method of manufacturing III – V compound crystals used in the semiconductor devices, the vapor epitaxial growth process is mainly adopted from the viewpoints of suitability to mass production and of easy controllability of the characteristics of crystals. In the vapor growth process, the gas of hydrogen halide is often used as a transport agent of a group III element. More specifically, the gas of hydrogen halide diluted with hydrogen gas carried onto a group III element source being held at a high temperature, reacts with the source to form a gaseous halide of the III element. The group III element halide together with a gas mixture containing a group V element is carried onto substrate crystals being held at a lower temperature where epitaxial growth of III – V compound occurs.

The reaction process will now be explained with a GaP layer is epitaxially grown on a GaAs substrate by using the Ga - $PCl_3$ - $H_2$ flow system.

FIGS. 1*a* and 1*b* are a schematic longitudinal section of a vapor growth reactor and a diagram of a temperature distribution within the reactor, respectively, as are used for the explanation.

Referring to FIG. 1*a*, numeral 1 designates a reaction tube. Numerals 2 and 3 designate a gas introducing port and a gas exhaust port of the reaction tube, respectively. A source material of Ga 5 contained in a boat 4 is put on the gas introducing port side of the reaction tube 1, while a GaAs substrate 7 placed on a holder 6 is put on the gas exhaust port side. The reaction tube 1 has the outer periphery surrounded by an electric furnace (not shown). Thus, as shown in FIG. 1*b*, the Ga source material is heated to approximately 930°C (1200°K), while the GaAs substrate 7 to approximately 830°C (1100°K). Introduced through the gas introducing port 2 into the reaction tube 1 is a gas mixture consisting of hydrogen which has previously flowed through $PCl_3$ maintained at 0°C at a flow rate of 100 cc/min, and subsequently added hydrogen at a flow rate of 140 cc/min for use in dilution.

The interior of the reaction tube 1 may be considered as being divided into the following four regions, from the aspect of the reaction process induced in the reaction tube 1. Region 1 is a gas pre-heating zone, region II is a source material zone, region III is a gas mixing zone, and region IV is a III – V compound deposition zone. The reactions occurring in each region are as follows.

a. In region I, $$4PCl_3 + 6H_2 \rightleftharpoons 12HCl + P_4 \qquad (1)$$

As the temperature becomes high, $$P_4 \rightleftharpoons 2P_2 \qquad (2)$$

The equilibrium constant $k_2$ of equation (2), $k_2 = p_{2P}^2/p_{P_4}$ where $p_k$ represents the partial pressure of a material $k$.

Since the vapor pressure of $PCl_3$ at 0°C is 36 Torr, the partial pressure of $PCl_3$ under the above growing conditions is evaluated as:

$p_{PCl} = 4p_{P_4} + 2p_{P_2} = 36/\mathbf{760}\ \mathbf{100/240}$ atm.

$= 2 \times 10^{-2}$ atm. On the other hand, the equilibrium constant $k_2$ at 1200°K (approximately 930°C) is:

$k_2\ (1200°K) = 10^{-2}$

Therefore, the partial pressures $p_{P_2}$ and $p_{P_4}$ of $P_2$ and $P_4$ in the region II are:

$p_{P_2} = 5 \times 10^{-3}$ atm.

$p_{P_4} = 2.5 \times 10^{-3}$ atm.

b. In region II, Ga reacts with HC1 produced by the reaction of equation formula (1)

$$2HCl_{(g)} + 2Ga_{(l)} \rightleftharpoons 2GaCl_{(g)} + H_{2(g)} \qquad (3)$$

The equilibrium constant $k_3$ of equation (3), $k_3 = p^2GaCl\ \ p_{H_2}/p^2HCl$ At 1200°K, the dissociation pressure of GaP is $p_P = 1 \times 10^{-5}$ atm, and the partial pressure of $P_2$ on the Ga source 5 is high in comparison with this pressure. It is therefore considered that $Ga_{(1)}$ is covered with $GaP_{(s)}$ layer. Herein, symbol (g) indicates gas, (1) liquid, and (s) solid. Accordingly, the reaction between GaP and HCl is naturally induced, $$2GaP_{(s)} + 2HCl_{(g)} \rightleftharpoons 2GaCl_{(g)} + H_{2(g)} + P_{2(g)} \qquad (4)$$

The equilibrium constant $k_4$ of equation (4), $k_4 = p^2GaCl\ \ p_{H_2}\ p_{P_2}/p^2HCl$ At 1200°K, $k_4\ (1200°K) = 2.5 \times 10$ Under the normal growing conditions, $p_{H_2} \sim 1$ atm, and hence, from the above equation, $p_{HCl} = [1 \times (5 \times 10^{-3})\ ½/(2.5 \times 10^{-1})\ ½\ p_{GaCl}] = 0.14\ p_{GaCl}$ If $p^i_{HCl}$ represents the partial pressure of HCl in the region I (the partial pressure of HCl introduced into the reaction tube), $p_{HCl} = p^i{}_{HCl} - p_{GaCl}$ Hence, there is ultimately obtained the result:

$p_{HCl} = 0.12\ p^i{}_{HCl}$

This demonstrates that approximately 12 percent of initially introduced HCl passes through the region III to come onto the substrate 7 in the region IV. On the substrate 7, in addition to the following GaP deposition reaction occurs:

$$3GaCl_{(g)} + 2P_{(g)} \rightleftharpoons 2GaP_{(s)} + GaCl_{3(g)} \qquad (5)$$

the following sub-reaction is generated:

$$2GaAs_{(s)} + 2HCl \rightleftharpoons 2GaCl_{(g)} + 2(As)_{(g)} + H_{2(g)} \qquad (6)$$

This means that etching of the substrate 7 is caused.

Especially in a transient state until phosphorus is saturated into the Ga source 5, the partial pressure of phosphorus in the vapor phase becomes remarkably low. As a result, the reaction of equation (5) does not proceed in the direction of forming GaP, and equation (6) becomes dominant. Then, the surface of the substrate 7 is markedly etched, and the crystalline quality of grown layer becomes poor. In extreme cases, phosphorus is rapidly diffused into the substrate through arsenic vacancies formed in the surface, to make the substrate surface amorphous.

If, in order to prevent such phenomenon, the growing experiment is carried out under an atmosphere of excessive phosphorus, the abovementioned transient state or time may be eliminated or shortened. The GaP concentration in the vapor phase is thus made high, thereby serving to improve the crystalline quality. Since, however, the partial pressure of phosphorus becomes higher than in the case of using only $PCl_3$, $p_{HCl}$ on the Ga source 5 increases, that is, the amount of HCl flowing onto the substrate under a condition unreacting with the Ga source 5, as is apparent from the foregoing analysis. As a result, the etching reaction of GaP $$2GaP_{(s)} + 2HCl_{(g)} \rightleftarrows 2GaCl_{(g)} + P_{2(g)} + H_{2(g)} \quad (7)$$

is facilitated, and the GaP forming reaction in equation (5) is suppressed. Therefore, the GaP growing speed becomes low. In addition, the crystalline quality of the grown layer tends to become non-uniform by being influenced by delicate concentration gradients and temperature differences. For example, a minute variation in the pressure phosphorus affects the amount of HCl flowing onto the substrate, and accordingly, the growing speed of the growth layer and the extent of etching of the grown layer. Therefore, a number of deep etch pits are sometimes generated in the grown layer, and the crystalline quality becomes poor.

Particularly in case where the substrate is of a material, such as Ge and Si, other than GaAs and GaP, the material constituting the etched substrate is at once deposited onto the wall of the reaction tube, and undergoes auto-doping even after the growth starts. As a result, the material is incorporated into the grown layer as an electrically active impurity. Usually, the incorporation of these materials due to such a process brings about a substantial degradation of the electrical properties of the grown layer.

SUMMARY OF THE INVENTION

An object of the present invention is to provide a method which suppresses the above-mentioned problem in a prior-art process of the vapor epitaxial growth of III – V compound semiconductors; that is, to reduce the concentrations of HCl, which is un-reacted with a Ga source material and flowing onto a substrate, to the extent of raising no problem in practical use, whereby the degradation of an epitaxial grown layer due to etching of a substrate, the incorporation of a substrate material into the grown layer and the decrease in the growing speed of the growth layer are prevented.

In order to suppress the partial pressure of HCl flowing onto a substrate, the present invention disposes, in a region (region III in FIG. 1a) between a group III element of the first source material set at a high temperature and the substrate set at a lower temperature, an appropriate material (which is termed the second source material) acting substantially as electrically active impurity for a III – V compound semiconductor to be grown on the substrate, said material being selected from the group consisting of III – V compound semiconductors and constituent elements of said compound semiconductors.

Thus, it will be understood that a prominent feature of the present invention resides in that a subhalide or suboxide of a group III element formed by reacting a source material composed of the group III element, which is maintained at an elevated temperature, with a hydrogen halide or steam is combined in the vapor phase with a volatile group V element, the resulting gas mixture is reacted with a second source material, and the reaction product gas is contacted with a prescribed substrate to thereby grow the group III-V compound epitaxially on said prescribed substrate.

As a result, when GaP is selected as the second source material in, e.g., the growth of InP, the reaction of equation (4) is generated on the second source material GaP. When the first and second source materials are held at approximately 1200°K, the amount of HCl flowing onto the second source material GaP is about 10 percent of the HCl introduced into a reaction tube. It is put as $p^{i\,\prime}_{HCl}$. Then, since substantially the same equilibrium constant and partial pressure as in equation (4) are also given at the position of the second source material, the equilibrium partial pressure of HCl on the second source material, $p'_{HCl}$ becomes to be nearly 10 percent of $p^{i\,\prime}_{HCl}$. By considering the relation of $p^{i\,\prime}_{HCl} = p_{CHl}$, only about 1 percent of HCl generated from $PCl_3$ and introduced into the reaction tube arrives at the substrate, and so the problem of the etching of the substrate by HCl can be substantially negligible.

In the above case, the partial pressure of phosphorus is given by $PCl_3$ only. In addition, in case an excessive amount of phosphorus is added to the reaction system, the partial pressure of phosphorus rises, and so the amount of HCl arriving at the substrate is increased in comparison with the former case. When this phenomenon causes troubles, mentioned above, GaP, used as the second source material, is placed at two or more portions within region III. Then, the equilibrium partial pressure of HCl on the GaP source material which is closer to the substrate takes a value being at least one order lower in comparison with the case of using single second source. Thus, the amount of HCl reaching the substrate may be substantially suppressed.

While the above description deals with the epitaxial growth of GaP, similar reactions and phenomena are evidenced by the epitaxial growth of other III – V compounds such as GaAs, InAs and Ga(P, As) according to similar methods.

Further, although HCl has been described as the carrier gas of the group III element, similar phenomena and effects are also generated when other halogen gases and water vapor are used as carrier gases of the group III element.

A second effect of the use of the second source material is the regulation of the degree of supersaturation of a growing material in the reaction gas. The second source is particularly effective in the case of a substrate composed of a material which acts as an electrically active impurity when incorporated into the grown layer. More specifically, in case where a III – V compound is grown on an isoelectric GaAs substrate, the substrate is placed in a super-saturated region where the surface catalysis of the substrate dominantly influences growth. Then, a grown layer of the most preferable crystalline quality can be obtained. If the degree of supersaturation in such region is comparatively low, the substrate tends to be etched by the un-reacting HCl. For this reasons, when a substrate composed of material acting as an electrically active impurity is used, the growth should be carried out in a region of higher degree of supersaturation. In such region, however, although the substrate etching is reduced, the growing speed is too high and the crystalline quality tends to become poor. Accordingly, in the present invention the second source material is placed in region III close to the substrate. The second source serves as a regulator of the degree of super-saturation as well as a consumer of HCl un-reacted with Ga source in the transient state until the group V element is saturated. That is, decomposition onto the second source takes place prior to the deposition onto the substrate when the degree of supersaturation is so great that the crystalline quality of the grown layer on the substrate would be disburbed. The crystalline quality of the III – V compound grown on the substrate is accordingly improved remarkably.

Further, the use of the second source material yields an additional effect. It may serve as a dopant source. More specifically, the second source material is etched by HCl un-reacted with the first source material and carried onto the substrate. Accordingly, if a desired impurity is previously doped into the second source material, the impurity is necessarily doped into the grown layer. The quantity of doping may be regulated by the partial pressure of the excessive group V element. For example, in the case of the above-mentioned InP growth, when the excessive phosphorus pressure is not used, i.e., when the supply source of phosphorus is only $PCl_3$, approximately 1/10 of the concentration of impurities contained in the second source material is doped into the grown layer. When the excessive phosphorus pressure is exerted, the amount of HCl leading onto the second source material increases. Therefore, the doped amount is further increased. Ultimately, the doping concentration may be perfectly controlled within a range of ten to several tens percent of the concentration of impurities contained in the second source material.

BRIEF DESCRIPTION OF THE DRAWINGS

These and other features, objects and advantages will become apparent from the following detailed description of various embodiments of the invention and the attendant drawings wherein.

DETAILED DESCRIPTION OF THE INVENTION

Figures 1A, 1B, 2A, 2B:
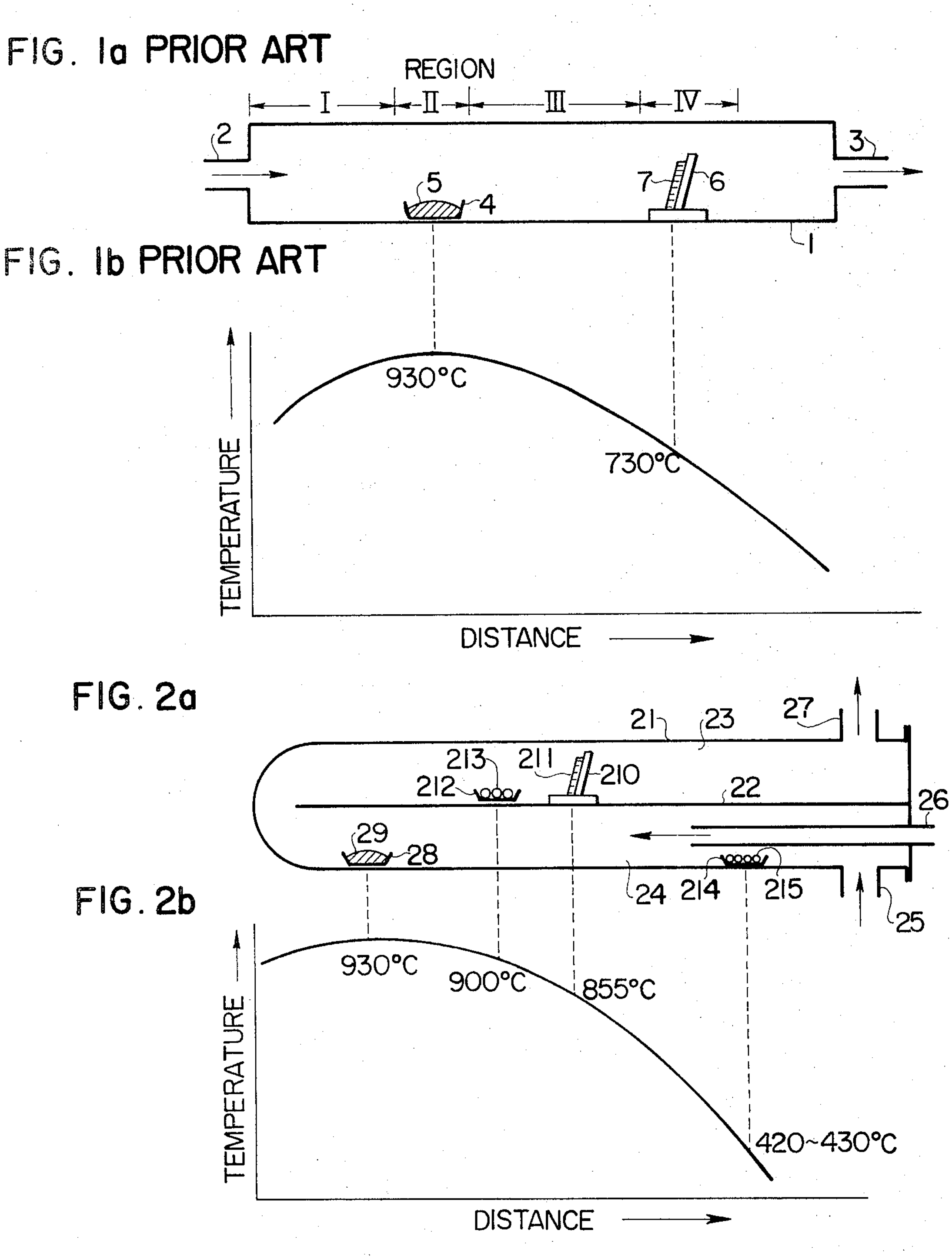
FIG. 1a PRIOR ART, FIG. 1b PRIOR ART, FIG. 2a, FIG. 2b
FIGS. 1*a* and 1*b* are a schematic longitudinal section of a prior-art vapor epitaxial growth reactor and a diagram of a temperature distribution in the reactor, respectively.
FIGS. 2*a* and 2*b* are a schematic longitudinal section of a vapor epitaxial growth reactor for use in the present invention and a diagram of a temperature distribution in the reactor, respectively.

The present invention will now be described in connection with the following practical embodiments thereof.

EMBODIMENT 1

FIG. 2*a* is a schematic sectional view of a reactor for the vapor growth used in the performance of the present invention.

The interior of a quartz tube 21 sealed at one end is divided into upper and lower reaction chambers 23 and 24 by a partition wall or flat quartz board 22. Reaction gases are introduced into the lower reaction chamber 24 through gas introducing ports 25 and 26 which are provided on the side of an open end of the reaction tube 21. Gases are turned at the sealed end of the reaction tube 21, and are passed through the upper reaction chamber 23. Thereafter, they are exhausted to the exterior through a gas exhaust port 27 which is provided on the side of the open end of the reaction tube 21.

At the position of the lower reaction chamber 24 which is close to the sealed end of the reaction tube 21, a group III element (the first source material) 29 contained in a quartz crucible or boat 28 is located. A substrate 211 is placed on a substrate holder 210 substantially at the center of the upper reaction chamber 23. In the upper reaction chamber 23 between the substrate 211 and the first source material 29, the second source material 213 contained in a crucible or boat 212 is placed. In addition, a low-temperature source material 215 contained in a crucible or boat 214 is positioned in lower reaction chamber 24 close to the gas introducing port 25.

An example wherein GaP was epitaxially grown on a GaAs substrate using the above reactor will be described hereinafter.

7g of Ga added with 0.15g of red phosphorus (P) was used as the first source material 29, 0.81g of undoped GaP polycrystals as the second source material 213, and 0.4g of red phosphorus (P) as the lowtemperature source material 215. The substrate 211 was prepared by a GaAs substrate of Te-doped n-type, carried (electron) concentration $1 \times 10^{18}cm^{-3}$, and of a face orientation (100) whose back and side surface were covered with $SiO_2$ films of thickness of approximately 5,000A, and whose front surface was mirror-likely polished. The substrate was etched beforehand with a mixed solution of sulfuric acid, hydrogen peroxide and water to remove dirt from the surfaces and damages induced by the polishing. The source materials and the substrate were mounted at the predetermined positions in the reaction tube 21. Then, gas substitution in the reaction tube 21 was carried out by flushing with hydrogen at a flow rate of 400cc per minute at the room temperature for about 1 hour.

Thereafter, the temperature of the reaction tube 21 was raised by means of an electric furnace (not shown) disposed outside the reaction tube 21. In the temperature raising process, the hydrogen flow rate was regulated at 100cc/min. When the temperature distribution shown in FIG. 2*b* was established, hydrogen was introduced into a $PCl_3$ bubbler held at 0°C. The hydrogen thus-saturated with $PCl_3$ was introduced into the reaction tube 21 through the gas introducing port 26 at a rate of 60cc per minute. Simultaneously therewith, hydrogen for dilution was fed into the reaction tube 21 through the gas introducing port 25 at a rate of 110cc per minute. After a lapse of 5 hours under this state, the flow of $PCl_3$ was stopped, the temperature was lowered, and the GaAs substrate 211 was taken out from the reaction tube 21. The result was GaP crystals having a thickness 265 $\mu$m and a mirror surface epitaxially grown on the GaAs substrate. After the GaAs substrate and the layer grown at this initial stage of the run were removed, a Hall measurement of the grown GaP layer was performed at the room temperature. The carrier (electron) concentration $n$ was found to be $2.3 \times 10^{15}cm^{-3}$, while the mobility was $195 cm^2/V{\cdot}sec$. The weight of the second source material 213 after the reaction was 0.58g.

Next, for the sake of comparison, GaP was epitaxially grown on a GaAs substrate in such a way that, as in the prior-art method, the second source material 213 was removed in the foregoing method of the present invention, and while other conditions were made exactly the same. The surface of a grown layer on a specimen obtained thereby after a reaction time of 5 hours, was dotted with hillock-like projections as large as 1.5 mm in the maximum diameter. The lower part of the grown layer, inherently at a slightly higher temperature than the upper part, was dotted with a number of pits of approximately 0.1 mm in diameter. The thickness of the grown GaP was approximately 160 $\mu$m. A Hall measurement of the GaP layer yielded an impurity concentration similar to the former case, whereas the mobility was lowered to approximately 130cm$^2$/V. sec at the room temperature. The result proves the remarkable effect of the second source material 213 employed in the present invention.

EMBODIMENT 2

In this embodiment, using the reactor in FIG. 2*a* as in the embodiment 1, mixed crystals Ga(P, As) were grown on a Ge substrate.

The substrate 211 was an n-type Ge single crystal substrate whose back and side surfaces were covered with double films of $SiO_2$ - Si approximately 1 $\mu$m thick, and having a face orientation (111). The first source material 29 was a mixture consisting of 8g of Ga, 0.9g of As and 0.15g of P, the second source material 213 was 1.62g of undoped GaAs polycrystals, and the low-temperature source material 215 was 2g of As. The gas introduced through the gas introducing port 25 of the reactor 21 was hydrogen containing 2 mol percent $AsH_3$ at a flow rate of 140cc per minute, while the gas introduced through the gas introducing port 26 was the same as in embodiment 1. The temperature distribution in the reaction tube 21 was regulated such that the substrate 211 was at 825° to 830°C, the second source material 213 at 860°C and the lower-temperature source material 215 at 520° to 530°C. The use of excessive lower-temperature source material As 215 is effective to obtain a Ga(P, As) layer with high As content at the initial stage of the growth, which moderates lattice deformations and defects appearing at the boundary between the substrate Ge 211 and the grown layer. The excessive As 215 was fully consumed after about 1 to 1.5 hours, and thereafter, the Ga(P, As) layer of fixed constituents was grown. Single crystals of $GaP_{0.45}As_{0.55}$ being 285 $\mu$m thick were formed on the substrate 211 after growth for about 5 hours. The mixed crystal ratio was determined from the analysis of the emission spectrum of a diode which was obtained by diffusing Zn into the grown layer. Since, under such growing conditions, group V elements become excessively prevalant, the degree of supersaturation necessarily is raised. Granular Ga(P, As) being approximately 1 mm in diameter was deposited on the wall of the reaction tube 21 from a place at approximately 920°C at an upper stream of the substrate 211 and the second source material 213. However, the surface of the epitaxial growth layer on the substrate 211 was flat, and was a mirror surface with metallic luster. The surface of the second source material 213 was partially turned red, and the weight was slightly increased to 1.71g in comparison with that before the reaction. The substrate 211 with the epitaxial layer was polished and removed, whereupon the Hall measurement of the grown layer was carried out. The carrier (electron) concentration was found to be 6.2 × $10^{15}$cm$^{-3}$, while the mobility was 1,850cm$^2$/V. sec at the room temperature.

Next, under quite the same conditions as in the above except that the second source material 213 was removed from the reaction system, Ga(P, As) was epitaxially grown on a Ge substrate 211. On the surface of a grown layer of a specimen which was taken out after completion of the reaction, fine growth pyramids of (111) were partially and closely concentrated. In addition, the thickness of the grown layer was 120 $\mu$m, less than one half of that where the second source material was used. Further, the substrate 211 was polished and removed from the specimen, and the Hall measurement of the grown layer was carried out. The result was that the grown layer exhibited carrier (electron) concentration *n* of 3 × $10^{18}$cm$^{-3}$, a mobility of 980cm$^2$/V·sec at the room temperature, and a composition of $GaP_{0.46}As_{0.54}$. This demonstrates that a considerably large amount of Ge penetrated from the substrate 211 into the grown layer by auto-doping. Granular Ga(P, As) was greatly deposited on the wall of the reaction tube 21 which had been maintained at 920° to 890°C, while Ga(P, As) films were greatly deposited in parts at temperatures lower than 890°C.

The foregoing result proves that, in addition to the effect of the second source material 213 as has been stated in embodiment 1, the second source material 213 is remarkably effective in being capable of regulating the degree of supersaturation in a region where said degree is high.

EMBODIMENT 3

Description will be made of a case where, using the reactor in FIG. 2*a* as in the embodiment 1, n-type GaAs was epitaxially grown on a GaAs substrate.

The first source material 29 in FIG. 2*a* consisted of 7g of Ga and 1.1g of As, the second source material 213 consisted of 1.45g of GaAs polycrystals doped with Te at 2 – 3 × $10^{18}$cm$^{-3}$ and 4.35g of high-impurity metal Ga, and the low-temperature source material 215 was 5.5g of As. The flow rates of gases at the reaction were 50cc/min. of hydrogen from the gas introducing port 25, and 70cc/min. of hydrogen saturated with $AsCl_3$ through the body of $AsCl_3$ (liquid) maintained at the room temperature, from the gas introducing port 26. Further, the temperature distribution was made such that the first source material 29 was at 850°C, the second source material 213 at 800°C, the substrate 211 at 780°C and the low-temperature source material 215 at 400° to 520°C.

After a growth of about 6 hours, an n-type GaAs layer of approximately 85 to 130 $\mu$m thick was deposited on the substrate 211 with a mirror surface. (The thickness of the grown layer was found to increase by raising the temperature of the low-temperature material As 215.) After the substrate was polished and removed, electrical properties of the grown layer were evaluated by the Hall measurement. The carrier (electron) concentration of the grown layer was found to differ dependent upon the temperature of the low-temperature source material As 215. When As 215 was held at 400°C, $n \cong 1.4 \times 10^{17}$cm$^{-3}$, at 450°C, $n \cong 3.4 \times 10^{17}$cm$^{-3}$, and at 520°C, $n \cong 6.8 \times 10^{17}$cm$^{-3}$.

It has been confirmed that, as the temperature of As 215 raised, the second source material 213 is increasingly consumed. The foregoing results demonstrate the fact that the amount of HCl flowing onto the second source material 213 is increased by raising the pressure of excessive arsenic, resulting in a greater consumption of the second source material to increase the carrier concentration within the grown layer, i.e., the second source material 213 effectively functions as a doping source for the grown layer by regulating the arsenic pressure.

EMBODIMENT 4

The interior of the quartz reaction tube 21 sealed at one end as shown in FIG. 2*a*, is divided into the two upper and lower chambers 23 and 24 by the partition wall 22. Reaction gases are introduced into the lower reaction chamber 24 through the gas introducing ports 25 and 26 which are provided at the open end of the tube, they are turned at the sealed end to pass through the upper reaction chamber 23, and they are exhausted to the exterior through the gas exhaust port 27. At predetermined positions within the reaction tube 21, there are put the source material 29 contained in the quartz crucible 28, the low-temperature source material 215 contained in the quartz crucible 214, the second source material 213 contained in the quarts crucible 212, and the single crystal substrate 211 placed on the substrate holder 210.

In this embodiment, using the above reactor, GaAs was epitaxially grown on a Ge substrate. 6g of gallium (Ga) added with 2.5g of As was used as the source material 29, 1.5g of undoped InAs polycrystals as the second source material 213, and 3g of As as the low-temperature source material 215. The substrate 211 was a Ge single crystal wafer doped with Sb, being 3 × $10^{17}cm^{-3}$ in the carrier concentration and having an orientation of (311). The back and sides of the substrate were covered with double films of $SiO_2$ - Si having a thickness of approximately 1 $\mu$m. The surface of the substrate was polished into mirror-like finish, whereupon it was etched with a mixed solution consisting of fluoric acid, hydrogen peroxide and sulfuric acid. After the materials and the substrate were mounted at the predetermined positions in the reaction tube 21, the gas flushing of the reaction tube 21 was carried out by hydrogen flowing at a rate of 400cc per minute at the room temperature for about 1 hour. Then, the temperature of the reaction tube 21 was raised by means of an electric furnace (not illustrated) which was disposed outside the reaction tube 21. In the process of raising the temperature, a hydrogen flow rate of 60cc/min was maintained until the temperature distribution became as shown in FIG. 2*b*. After this temperature distribution was reached, hydrogen flow was introduced into a bubbler of $AsCl_3$ held at 0°C, and the hydrogen thus-saturated with $AsCl_3$ was introduced into the reaction tube 21 through the gas introducing port 26 at a rate of 90cc per minute. Simultaneously therewith, hydrogen for dilution was fed into the reaction tube 21 through the gas introducing port 25 at a rate of 80cc per minute. After the lapse of 8 hours under this state, the flow of $AsCl_3$ was stopped, the temperature was lowered, and the Ge substrate 211 was taken out of the reaction tube 21. The result was a single crystal layer 112 $\mu$m thick epitaxially grown on the Ge substrate with a mirror surface. The substrate was polished and removed, and the composition of the grown layer was examined by chemical analysis. No indium was detected and it was confirmed that the layer consisted of GaAs. On the wall of the upper reaction chamber 23 within the reaction tube 21, compounds were deposited in the order of GaAs, (In, Ga) As and InAs in the direction of decreasing temperature, i.e., toward gas exhaust port 27. The Hall measurement of the GaAs grown layer showed that the carrier concentration was 2 × $10^{15}cm^{-3}$ at the room temperature, while the mobility was 7800cm²/V·sec. Such a low carrier concentration and high mobility demonstrated substantially no autodoping of the GaAs grown layer with Ge occured.

For comparison, however, the second source material or the InAs polycrystals 213 were removed from the reaction system, and GaAs was grown on a Ge substrate under the same growing conditions as above. The Hall measurement of a grown layer yielded a carrier concentration of 3 × $10^{16}cm^{13}$, and a mobility of 2300cm²/V·sec. In addition, deposits (GaAs layer) on the reaction tube wall at a part slightly lower in temperature than the Ge substrate were taken out, and subjected to chemical analysis. 100 to 300ppm of Ge were detected. This result suggests that a considerable amount of Ge was mixed by auto-doping into the GaAs grown layer.

EMBODIMENT 5

Hereinafter is described an embodiment wherein, using a reactor quite similar to that of embodiment 4, as shown in FIG. 2*a*, GaP was grown on a Ge substrate. Unlike the previous embodiment, the source material 29 was 7g of Ga added with 0.2g of red phosphorus, the second source material 213 consisted of 1.2g of undoped InP polycrystals, and the low-temperature source material 215 was 0.4g of red phosphorus. Predetermined temperatures to which the materials and the substrate were raised after substituting gases (flushing) within the reaction tube 21, were 930°C for the Ga source 29, 900°C for the InP source 213, 825°F for the substrate Ge 211 and 420° to 430°C for the low-temperature source 215. After this temperature distribution was reached, hydrogen was introduced into a bubbler of $PCl_3$ held in a container cooled at 0°C, and the hydrogen thus-saturated with $PCl_3$ was fed into the tube through the gas introducing port 26 at a rate of 60cc per minute. Simultaneously, hydrogen for dilution was fed in through the introducing port 25 at a rate of 90cc per minute. After the lapse of 5 hours under these conditions, the flow of $PCl_3$ was stopped, the temperature was lowered, and the substrate 211 was taken out. The result was single crystals with a mirror surface approximately 150 $\mu$m thick epitaxially deposited on the substrate. The Ge substrate was polished and removed, whereupon the compositions of the grown layer were examined by chemical analysis. No indium was detected, and the layer was found to be GaP. The deposition of InP onto the wall of the reaction tube was noticed at temperatures below 680°C. As the result of the Hall measurement of the GaP layer, the grown layer was determined to be of the n-type, having a carrier concentration of 3.5 × $10^{15}cm^{-3}$ at the room temperature and a mobility of 175cm²/V·sec.

Next, GaP was epitaxially grown on a Ge substrate under the same conditions except that the InP polycrystals of the second source material were removed. Although a GaP layer approximately 140 $\mu$m thick was obtained by the growth of 5 hours, the surface of the grown layer exhibited hillock-like protrusions, and was dotted at some places with pits of 0.1 mm or so in diameter. As a result of the Hall measurement, the carrier concentration was found to be 6 × $10^{16}cm^{-3}$, while the mobility was approximately $120cm^2/V\cdot sec$. This demonstrates the fact that the Ge substrate is etched by HCl un-reacted with the Ga source, so as to render the epitaxial growth unstable, and that Ge once etched is unintentionally doped into the GaP grown layer by the auto-doping effect.

EMBODIMENT 6

Description will be made of a case where InP was epitaxially grown on an InP single crystal substrate by a method quite similar to that of embodiments 4 and 5.

Unlike the embodiment 4, the source material 29 in FIG. 2*a* was 11g of In added with 0.2g of red phosphorus, the second source material 213 consisted of 1g of undoped GaP polycrystals, the low-temperature source material 215 was 0.4g of red phosphorus, and the substrate 211 was (100) InP single crystal. The substrate crystals were of the n-type, and had a carrier concentration of $6 \times 10^{17}cm^{-3}$. The respective predetermined temperatures in FIG. 2*b* were 900°C for the In source 29, 650°C for the InP substrate 211, and 400° to 410°C for the low-temperature source 215. The reaction gases introduced after the predetermined temperatures have been reached, were 25cc/minute of hydrogen saturated with $PCl_3$ at 0°C, and 60cc/minute of hydrogen for dilution. An epitaxial layer obtained on the substrate 211 after 8 hours of growing period of time, had a thickness of approximately 120 $\mu$m. When the compositions of the grown layer were examined by XMA, a slight amount of Ga was detected. The amount of Ga, however, was below 1 percent of that of In. The grown layer may be unquestionably regarded as made of InP single crystals in composition. The substrate was polished and removed, and then, the Hall measurement was carried out. As the result, the grown layer was found to be n-type having a carrier concentration of $2 \times 10^{15}cm^{-3}$ and a mobility of $3450cm^2/V\cdot sec$. On the other hand, in case where the GaP polycrystals 213 were not used, an InP layer of a thickness of approximately 125 $\mu$m (8 hours) was obtained under quite the same growing conditions as in the above, and hillock-like protrusions were noticed on the surface. As the result of the Hall measurement of the layer, the carrier concentration determined to be $8 \times 10^{15}$ $cm^{-3}$, while the mobility was $2030cm^2/V\cdot sec$.

Next, InP was epitaxially grown on an InP substrate under quite the same growing conditions as in the above, except that the second source 213 was made 1g of GaP single crystals doped with Te and at a carrier concentration of $8 \times 10^{17}cm^{-3}$. The substrate was polished and removed, whereupon the Hall measurement was carried out. The carrier concentration was $1 \times 10^{17}cm^{-3}$. Next, InP was grown using also the Te-doped GaP single crystals at the carrier concentration of $8 \times 10^{17}cm^{-3}$ as the second source 213 and under the same growing conditions as in the above except that the red phosphorus of the low-temperature source was maintained at 425° to 430°C. The Hall measurement of the grown InP was performed. The carrier concentration of the InP grown layer was found to be $3 \times 10^{17}cm^{-3}$.

The foregoing result demonstrates the fact that the second source material effectively functions also as a source of dopant impurities, and that the quantity of impurities doped into the grown layer may be controlled by controlling the transport ratio between the In source and the second source, i.d., regulating the In source and the partial pressure of HCl un-reacted with the In source. While, in the above case, the partial pressure of the un-reated HCl was varied by controlling the phosphorus pressure of the reaction system, the partial pressure of the un-reacted HCl may also be controlled by varying the temperature of the In source.

EMBODIMENT 7

In this embodiment GaP was epitaxially grown on the surface of an (111) substrate of a GaP single crystal, using the reactor as shown in FIG. 2*a* and using water vapor as the carrier gas of the source materials. The first source material 29 in FIG. 2*a* was 7g of Ga added with 0.2g of red phosphorus, the second source material 213 was 2g of InP polycrystals, and the low-temperature source material 215 was 0.5g of red phosphorus. The temperature distribution within the furnace at starting the growth was made the same as in embodiment 5. After such temperature distribution was reached, hydrogen was introduced into a container therein containing pure iced water. The hydrogen thus-saturated with water vapor was fed into the reaction tube through the gas introducing port 26 at a flow rate of about 100cc per minute. The flow rate of hydrogen for dilution as fed in through the other gas introducing port 25 was 100cc per minute. After maintaining this state for 5 hours, the flow of the hydrogen saturated with water vapor was stopped, heating of the reaction tube was stopped to lower the temperature thereof, and the substrate 211 was taken out.

It was confirmed that single crystals being approximately 120 $\mu$m thick with a mirror surface were epitaxially grown on the substrate thus obtained. The substrate was polished and removed. When the grown layer was subjected to chemical analysis, In was not detected at all. The Hall measurement showed that the epitaxially grown layer was n-type having a carrier concentration of $9 \times 10^{14}cm^{-3}$ and a mobility of $190cm^2/V\cdot sec$.

Next, GaP was epitaxially grown by quite the same method as the above process except that InP of the second source was not arranged. As a result, several hillock-like protrusions were noticed on the grown surface. Further, the growing speed was lower by about 20 percent relative to the case of using the second source.

The result of this embodiment proves that an effect owing to the use of water vapor as the carrier gas is large as in the case of using hydrogen halide.

Although, in the foregoing embodiments, description has been made of the cases where Ge and GaAs are used for the substrate, the invention is not restricted to such materials, but there may be quite similarly used other III – V compounds, I – VII compounds, II – VI compounds, Si, etc.

Although the examples provide for GaAs, InP, GaP or Ga as the second source material, the second source material may be the same III – V compound as the material to be epitaxially grown or at least one constituting element of the compound, or more generally, a III – V compound other than the compound to be epitaxially grown or at least one constituting element thereof.

It is understood that the embodiments disclosed herein are susceptible to numerous changes and modifications, as will be apparent to a person skilled in the art. Accordingly, the present invention is not limited to the details shown and described herein but intended to cover any such changes and modifications within the scope of the invention.

I claim:

1. In a method for growing a semiconductor compound epitaxially in a tube reactor system which comprises the steps of (1) reacting a source material composed of a group III element, which is maintained at an elevated temperature, with a hydrogen halide or steam, (2) combining in the vapor phase a subhalide or suboxide of the group III element formed at the step (1) with a group V element, and (3) contacting the resultant gas mixture of the subhalide or suboxide of the group III element and the group V element coming from the step (2) with a substrate material which is maintained at a temperature lower than the temperature of said source material and is selected from the group consisting of germanium, silicon, group III–V compounds, group I–VII compounds and group II–VI compounds, to thereby deposit on said substrate material a group III–V compound composed of the group III element of said source material and said group V element, the improvement wherein the gas mixture of the subhalide or suboxide of the group III element and the group V element is contacted with a second source material which is selected from the group consisting of group III elements other than said source material, group V element-doped group III elements other than said source material, and group III–V compounds other than said group III–V compound to be epitaxially deposited on said substrate material, and which is maintained at a temperature that is high enough for residual hydrogen halide or steam in the gas mixture to react with said second source material and that is higher than the temperature of the substrate material and lower than that of said source material composed of a group III element, whereby the concentration of the residual hydrogen halide or steam in said gas mixture is reduced and said gas mixture of the subhalide or suboxide of the group III element and the group V element is then contacted with said substrate material maintained at said lower temperature to thereby grow a prescribed group III–V compound epitaxially on said substrate material.

2. A method according to claim 1 wherein the III – V compound of the second source material includes one element which is the same as an element of the deposited epitaxial layer.

3. A method according to claim 1, wherein said second source material is previously doped with dopant impurities in an amount exceeding that desired in the III–V compound epitaxial layer and the partial pressure of the material of said volatile group V element in the gas mixture of the subhalide or suboxide of the group III element and the volatile group V element in the vicinity of said second source material is regulated to thereby control the amount of the impurities doped in said epitaxial layer.

4. A method according to claim 1, wherein the second source material is a group III element other than said source material.

5. A method according to claim 1, wherein the second source material is a group V element-doped group III element other than said source material.

6. A method according to claim 1, wherein the second source material is the group III–V compound other than the group III–V compound deposited on said substrate material.

* * * * *